United States Patent
Xi et al.

(10) Patent No.: US 10,491,172 B2
(45) Date of Patent: Nov. 26, 2019

(54) SYSTEMS AND METHODS PROVIDING A MATCHING CIRCUIT THAT BYPASSES A PARASITIC IMPEDANCE

(71) Applicant: QUALCOMM INCORPORATED, San Diego, CA (US)

(72) Inventors: Tianzuo Xi, Waltham, MA (US); Haichuan Kang, Wilmington, MA (US); ZhenQi Chen, Shirley, MA (US); Zhenying Luo, Wayland, MA (US); Xiangdong Zhang, Westford, MA (US); Xinwei Wang, Dunstable, MA (US); Yanjie Sun, Waltham, MA (US); Yan Kit Gary Hau, Westford, MA (US); Jing-Hwa Chen, Sudbury, MA (US)

(73) Assignee: QUALCOMM Incorporated, San Diego, CA (US)

( * ) Notice: Subject to any disclaimer, the term of this patent is extended or adjusted under 35 U.S.C. 154(b) by 12 days.

(21) Appl. No.: 15/349,225

(22) Filed: Nov. 11, 2016

(65) Prior Publication Data
US 2018/0048270 A1 Feb. 15, 2018

Related U.S. Application Data

(60) Provisional application No. 62/372,713, filed on Aug. 9, 2016.

(51) Int. Cl.
*H03F 1/56* (2006.01)
*G06F 1/16* (2006.01)
(Continued)

(52) U.S. Cl.
CPC ........... *H03F 1/565* (2013.01); *G06F 1/1616* (2013.01); *G06F 1/1626* (2013.01);
(Continued)

(58) Field of Classification Search
CPC . H03F 3/195; H03F 3/19; H03F 1/565; H03F 3/45071; H03F 2200/387;
(Continued)

(56) References Cited

U.S. PATENT DOCUMENTS 6,181,200 B1 * 1/2001 Titizian ................. H01L 23/642
257/E21.008
6,300,827 B1 10/2001 King
(Continued)

OTHER PUBLICATIONS

<Span style="font-family: calibri;">Alsuraisry H., et al., "5.3 GHz 42% PAE Class-E Power Amplifier with 532 mW/mm2 Power Area Density in 180 nm CMOS Process", Electronics Letters, Jul. 21, 2016, vol. 52, No. 15, pp. 1338-1340.
(Continued)

*Primary Examiner* — Yuwen Pan
*Assistant Examiner* — Fatuma G Sherif
(74) *Attorney, Agent, or Firm* — Haynes and Boone, LLP

(57) ABSTRACT

A circuit including a radio frequency (RF) amplifier including a transistor configured to receive an RF signal at its control terminal, a capacitor coupled to a first terminal of the transistor, an inductor coupled to a second terminal of the transistor, wherein the capacitor and inductor form a loop from the first terminal to the second terminal, wherein the loop bypasses a parasitic inductance between the second terminal and ground.

29 Claims, 4 Drawing Sheets

(51) Int. Cl.
*H01L 23/498* (2006.01)
*H01L 23/66* (2006.01)
*H01L 23/00* (2006.01)
*H01L 29/20* (2006.01)
*H01L 29/737* (2006.01)
*H03F 3/195* (2006.01)
*H03F 3/24* (2006.01)
*H04B 1/38* (2015.01)
*H05K 1/11* (2006.01)
*H05K 1/18* (2006.01)
*H03F 3/193* (2006.01)

(52) U.S. Cl.
CPC .. *H01L 23/49827* (2013.01); *H01L 23/49844* (2013.01); *H01L 23/66* (2013.01); *H01L 24/06* (2013.01); *H01L 24/46* (2013.01); *H01L 29/20* (2013.01); *H01L 29/737* (2013.01); *H03F 3/193* (2013.01); *H03F 3/195* (2013.01); *H03F 3/245* (2013.01); *H04B 1/38* (2013.01); *H05K 1/115* (2013.01); *H05K 1/18* (2013.01); *H01L 2223/6616* (2013.01); *H01L 2223/6655* (2013.01); *H01L 2224/04042* (2013.01); *H01L 2224/16225* (2013.01); *H01L 2224/4813* (2013.01); *H01L 2224/4911* (2013.01); *H01L 2224/73257* (2013.01); *H03F 2200/387* (2013.01); *H05K 2201/1003* (2013.01); *H05K 2201/10015* (2013.01); *H05K 2201/10166* (2013.01)

(58) Field of Classification Search
CPC ........... H03F 3/245; H03F 3/193; H04B 1/38; H01L 29/737; H01L 23/66; H01L 2224/4813; H01L 2224/16225; H01L 2224/73257; H01L 2224/4911; H01L 2223/6655; H01L 2224/04042; H01L 2223/6616; H01L 23/49827; H01L 24/06; H01L 29/20; H01L 23/49844; H01L 24/46; G06F 1/1616; G06F 1/1626; H05K 2201/10166; H05K 2201/10015; H05K 2201/1003; H05K 1/115; H05K 1/18
See application file for complete search history.

(56) References Cited

U.S. PATENT DOCUMENTS

| | | | |
|---|---|---|---|
| 6,924,701 B1 | 8/2005 | Bhandari | |
| 8,686,796 B2 | 4/2014 | Presti | |
| 8,847,351 B2 | 9/2014 | Klemens et al. | |
| 2003/0194976 A1* | 10/2003 | Bhatti | H04B 1/0458 455/91 |
| 2005/0236689 A1 | 10/2005 | Sugiura et al. | |
| 2011/0285475 A1* | 11/2011 | Lu | H04B 1/48 333/104 |
| 2012/0146723 A1 | 6/2012 | Blednov et al. | |
| 2013/0207732 A1* | 8/2013 | Cabanillas | H03F 1/347 330/307 |
| 2014/0266459 A1* | 9/2014 | Scott | H03F 3/195 330/294 |
| 2015/0235941 A1 | 8/2015 | Nishijima et al. | |
| 2015/0303881 A1* | 10/2015 | Blednov | H03F 3/213 330/289 |
| 2016/0142015 A1* | 5/2016 | Volokhine | H03F 1/565 330/307 |
| 2016/0233849 A1* | 8/2016 | Marbell | H01L 23/66 |

OTHER PUBLICATIONS

International Search Report and Written Opinion—PCT/US2017/045196—ISA/EPO—dated Oct. 19, 2017.

* cited by examiner

SYSTEMS AND METHODS PROVIDING A MATCHING CIRCUIT THAT BYPASSES A PARASITIC IMPEDANCE

CROSS-REFERENCE TO RELATED APPLICATIONS

The present application claims the benefit of U.S. Provisional Patent Application No. 62/372,713, filed Aug. 9, 2016, and entitled "Systems and Methods Providing a Matching Circuit that Bypasses a Parasitic Impedance," the disclosure of which is incorporated by reference herein in its entirety.

TECHNICAL FIELD

This application relates to radio frequency (RF) receivers, and more particularly, to RF receivers implementing an impedance matching circuit that bypasses a parasitic impedance.

BACKGROUND

Wireless systems typically include a transmitter and receiver coupled to an antenna to send and receive Radio Frequency (RF) signals. Generally, a baseband system generates a digital signal that includes encoded information (data), and the digital signal is converted to an analog signal for transmission. The analog signal is processed and typically modulated (up converted) to an RF carrier frequency. After up conversion, the RF signal is coupled to an antenna through a power amplifier. The power amplifier increases the signal power so that the RF signal can communicate with a remote system, such as a base station, for example.

In one example conventional power amplifier, the emitter of the core transistor is connected to a printed circuit board (PCB) ground layer through a backvia of GaAs Die and vias in PCB. A capacitor and an inductor are included in the design to provide impedance matching with the load. The arrangement of the conventional power amplifier includes a loop, where a first node of the matching inductor is coupled to the collector of the core transistor, and the matching capacitor is coupled to the other node of the matching inductor. The matching capacitor couples the second node of the inductor to vias in the PCB. Vias in the PCB are coupled to backvias of the GaAs die, which are coupled to the emitter of the core transistor. Or put another way, the LC matching circuit is part of a loop from the collector to the emitter, where the loop includes vias of the PCB and the backvias of the semiconductor die, thereby including parasitic inductance of the vias and backvias within the loop. This allows a relatively high level of RF current to flow back to the emitter.

The parasitic inductance and resistance of the backvia of GaAs Die and vias in PCB limits the achievable output power, power added efficiency (PAE) and gain especially with higher operating frequency or larger transistor size which is used for higher output power. With the increasing operating frequency and transistor size (for higher output power), the ground parasitic inductance is becoming one of the major limitation of the power amplifier (PA) achievable output power, PAE.

The effect of this parasitic inductance of the vias and backvias is normally called "emitter degeneration of amplifiers" in Bipolar technology or "source degeneration of amplifiers" in CMOS technology. The RF current is directly fed back to the input signal decreasing the power gain, output power and PAE of the amplifier. Or put another way, resonance attributable to the parasitic inductance of the GaAs backvia and PCB via feeds back RF signal current to the emitter of the core transistor.

Additionally, the Quality factor (Q) of the matching capacitor in the output matching circuits can be limited when off-the-shelf capacitors are used for the matching capacitor. This may contribute to insertion loss, then decrease the output power, PAE and gain. For example, the commercial off-chip capacitor with ~10 pF capacitance value has around Q of 30 and resonance frequency of 3.5 GHz. In some instances, the self-resonance frequency of the capacitor is too low for higher frequency power amplifiers. Accordingly, it would be desirable to have a power amplifier architecture that increases the PAE of the amplifier and uses components that have a higher Q.

SUMMARY

According to one embodiment, a circuit includes: a radio frequency (RF) amplifier including a transistor configured to receive an RF signal at its control terminal, a capacitor coupled to a first terminal of the transistor, an inductor coupled to a second terminal of the transistor, wherein the capacitor and inductor form a loop from the first terminal to the second terminal, wherein the loop bypasses a parasitic inductance between the second terminal and ground.

According to another embodiment, a radio frequency (RF) amplifier circuit includes a semiconductor die having a transistor formed therein, the transistor including a control terminal configured to receive an RF signal, the transistor further including a first terminal coupled with a power supply and a second terminal coupled with a ground plane; a printed circuit board (PCB) on which the semiconductor die is mounted, wherein the PCB includes the ground plane and a first via coupling the ground plane to a second via coupled to the second terminal of the transistor; and a capacitor and an inductor coupled between the first terminal of the transistor and the second terminal of the transistor to form a loop that terminates at a node between the second terminal and the second via, the capacitor and inductor matching an impedance of a load of the amplifier circuit.

According to another embodiment, a computing device configured to communicate by a wireless radio frequency (RF) technology, the computing device including: a semiconductor die; a transistor formed on the semiconductor die, the transistor configured to receive an RF signal at a control terminal and to output an amplified RF signal at a first terminal, the transistor having a second terminal coupled to a ground plane by a first via in the semiconductor die; and a load component receiving the amplified RF signal from the transistor; and means for matching an impedance of the load component, wherein the means for matching the impedance comprises an impedance path from the first terminal of the transistor to the second terminal of the transistor and bypassing a parasitic inductance of the first via.

According to another embodiment, a method including: receiving an RF signal at a power amplifier; and amplifying the RF signal by the power amplifier, wherein the power amplifier includes a transistor receiving the RF signal at its control terminal, a capacitor coupled to a first terminal of the transistor, and inductor coupled to a second terminal of the transistor, wherein the capacitor and inductor form a loop from the first terminal to the second terminal, wherein the loop bypasses a parasitic inductance attributable to a plurality of vias between the second terminal and ground.

DESCRIPTION

Figure 1:
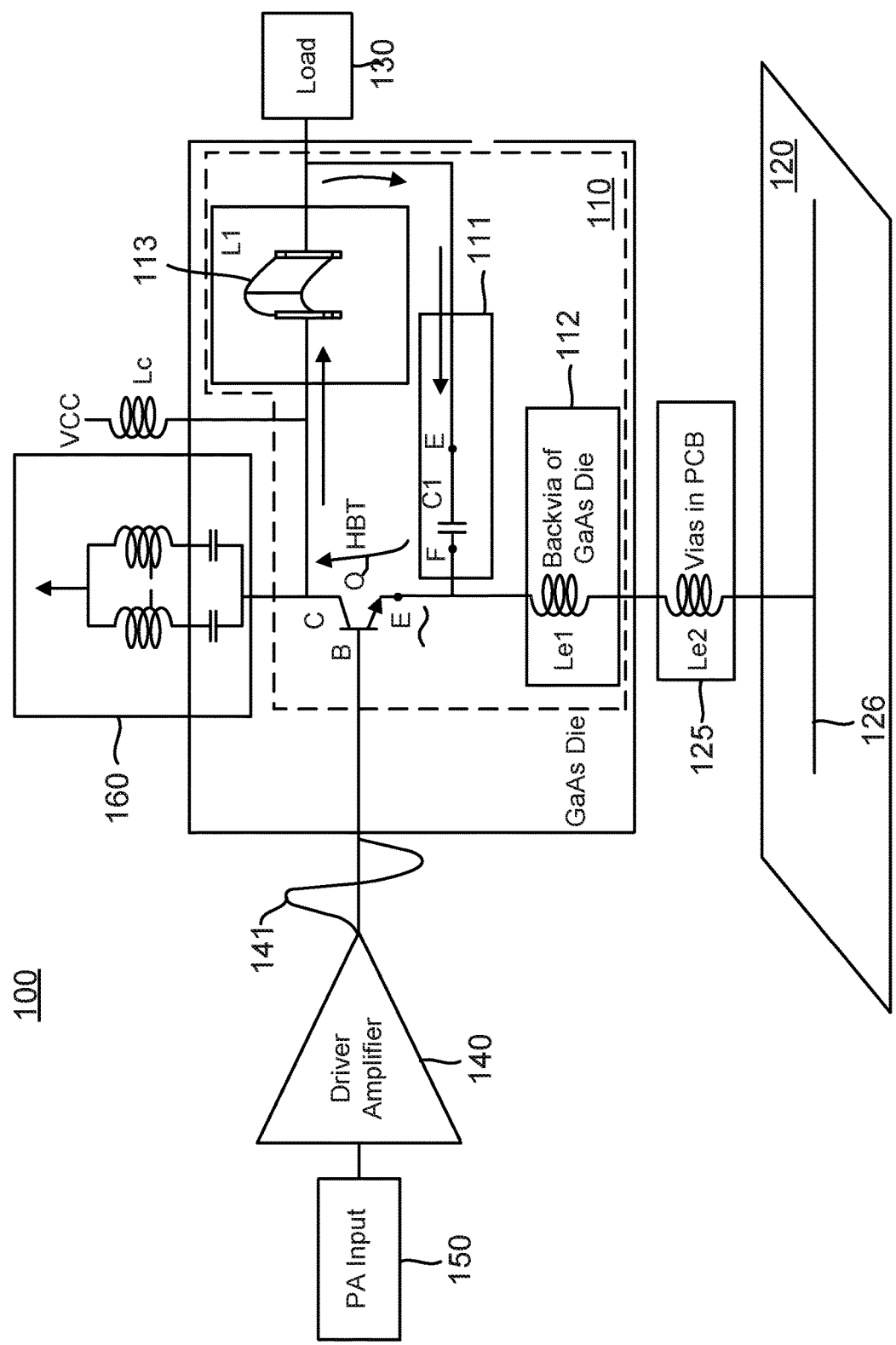
FIG. 1 illustrates an example amplifier architecture in accordance with an embodiment of the disclosure.

Various embodiments proposed herein include an arrangement for the matching capacitor and matching inductor to decrease the amount of RF signal current that is fed back into the emitter of the core transistor. The emitter of the core transistor is shorted to the ground plate of the capacitor. The inductor is coupled to the collector so that the inductor and capacitor form a loop from the collector to the emitter. This loop bypasses the parasitic inductance of the backvia and of the via that is located between the emitter and ground. Thus, the RF current through the backvia is largely reduced, as is the emitter degeneration.

Additionally, such embodiments may increase the Q factor by implementing the matching capacitor on a semiconductor (e.g., GaAs) chip using metal plates rather than an off-the-shelf and off-chip capacitor. The on-chip capacitor design may be tuned to increase the Q factor to around 80, though the scope of embodiments is not limited to any value for Q. Furthermore, the inductor may be implemented as bond wires, tuning the length and height to provide a relatively high Q factor as well. In one example, the higher the bond wire from the surface of the chip, the less coupling there is between the bond wire and components on the chip, thereby increasing the Q factor. Such arrangements of the matching capacitor and matching inductor may also be more efficient with package area cost than the traditional design that uses off-chip capacitors and inductors.

Various embodiments include methods to use the power amplifiers described herein. For instance, one method may include receiving an RF signal at a driver amplifier and then passing an amplified signal to the core transistor. The core transistor acts as a power amplifier and is impedance-matched to a load. Signals at the collector of the transistor are fed back to the emitter of the transistor through an impedance matching loop that bypasses the parasitic inductance of the semiconductor die backvia and vias in the PCB to which the semiconductor die is coupled. The result is that the power amplifier amplifies the RF signal for the load while experiencing less emitter degeneration.

The amplifier embodiments may be implemented in a computing device having an RF transceiver. Examples of such computing devices include smart phones, tablet computers, laptop computers, and the like. For instance, computing devices may include antennas that transmit and receive wireless RF signals according to various protocols, such as IEEE 802.11 (Wi-Fi), Bluetooth, 4G and 5G mobile technologies, and the like. RF amplifiers can be used to amplify received signals or amplify signals to be transmitted, as appropriate.

Some embodiments may include an amplifier having a transistor with an emitter, wherein the emitter is coupled to an impedance path. The impedance path may include an impedance matching capacitor (e.g., the emitter may be coupled to the impedance matching capacitor). The scope of embodiments further includes that the capacitor may be implemented on a GaAs die, that the capacitor is floating with respect to RF, that inductance may include a bond wire, that the bond wire may couple a collector of the transistor to the capacitor, and that there may be a connection to a via filled in with metal.

FIG. 1 illustrates an example power amplifier arrangement, according to one embodiment. FIG. 1 provides an exploded view of various circuit components, some of them implemented upon GaAs die 110, PCB 120, or elsewhere within a computing device. The components shown in FIG. 1 include portions of an RF transceiver coupled with load 130.

Power amplifier input 150 receives an RF signal from an upstream component (not shown) and passes that RF signal to the driver amplifier 140. The driver amplifier 140 amplifies the RF signal to an appropriate level before the RF signal is applied to the power amplifier on GaAs die 110. Driver amplifier 140 may include an op amp or other appropriate amplifier suitable for the illustrated multi-stage amplification.

The amplified RF signal 141 is output from driver amplifier 140 and input to the base of the core transistor Q_HBT. In this example, the core transistor is implemented as a heterojunction bipolar transistor, having a collector coupled with bond wires 113 and with harmonic trap 160 and having an emitter coupled with capacitor C1 and backvia 112. Harmonic trap 160 provides filtering for higher-frequency unwanted signals and may be tuned for a given application using simulation or other techniques. Backvia 112 is implemented within the die 110, and it has a value for parasitic inductance Le1. Capacitor C1 is implemented on the die 110 within area 111. As described in more detail below, capacitor C1 may be implemented using metal plates within die 110.

An example PCB 120 includes a structure of FR4 or other suitable insulating material arranged in multiple layers. PCB 120 also includes multiple layers of conductor, such as copper, distributed between the layers of insulating material. An example conductive layer includes the ground layer 126, and it is understood that PCB 120 may include other conductive layers to carry power and signals, where those other conductive layers are not shown for ease of illustration. The PCB 120 includes vias 125, which have parasitic inductance Le2. Vias 125 couple backvias 112 to ground plane layer 126. In other words, ground plane layer 126 is coupled to the emitter of Q_HBT by via 125 and backvia 112.

The power amplifier having core transistor Q_HBT uses capacitor C1 and bond wires 113 for impedance matching to load 130. For instance, in an example in which load 130 has an impedance of 50 ohms, capacitor C1 and bond wires 113 (having inductance L1) may be selected to provide an appropriate amount of reactance to prevent degradation of the signal due to reflection. An example of load 130 includes an antenna, an output jack, or other component that receives the amplified RF current from the transistor. While this example refers to a load having an impedance of 50 ohms, it is understood that the scope of embodiments includes any appropriate load with any appropriate impedance. For example, other embodiments may include an antenna with a 12 ohm impedance, and values for C1 and L1 may be selected to reduce or eliminate reflection accordingly.

In this example, the capacitor C1 and the bond wires 113 form a loop from the collector to the emitter of the core transistor Q_HBT, where the loop is indicated by arrows in FIG. 1. The loop from the collector to the emitter, including the bond wires 113 and capacitor C1, bypasses the parasitic inductance Le1 and Le2 between the emitter and the ground layer 126. Of further note, the capacitor C1 is floating with respect to the RF signal, rather than being coupled directly to ground plane 126.

The embodiment of FIG. 1 may include one or more advantages over conventional power amplifiers. For instance, some conventional power amplifiers may include the matching inductor and capacitor coupled to the PCB ground layer 126, thereby forming a loop that includes vias 112 and 125. By contrast, the embodiment of FIG. 1 configures the loop to bypass vias 112 and 125, thereby reducing the amount of RF current through the vias 112 and 125. The reduction in RF current through vias 112 and 125 correspondingly reduces emitter degeneration. Nevertheless, the amount of DC current through vias 112 and 125 may remain the same when compared to such conventional power amplifiers; however, emitter degeneration is typically a function of RF current rather than DC current.

Another feature of the embodiment of FIG. 1 is that capacitor C1 is built within area 111 of the semiconductor die 110 and, thus, is on-die. By contrast, some conventional power amplifiers may use off-the-shelf capacitors that are coupled to a PCB. On-die capacitor C1 in this example may be formed using parallel metal (e.g., copper) layers disposed between dielectric layers of the semiconductor die 110. An advantage of building the capacitor C1 on-die is that the parallel metal layers may be designed according to simulation to provide a high Q factor at expected operating frequencies. For example, if the expected operating frequency is around 2.5 GHz, the parallel metal layers within the semiconductor die 110 may be designed to have a shape, size, and distance from each other to provide a high Q factor at 2.5 GHz. A higher Q factor may be expected to provide better signal quality in a finished product.

By contrast, some off-the-shelf capacitors may be designed for use at around 3.5 GHz or 5 GHz, and therefore may provide a lower Q factor at the intended frequency of 2.5 GHz. However, the scope of embodiments is not limited to any frequency of use. Rather, various embodiments may be adapted for use with any appropriate frequency band through use of simulation and/or prototyping to achieve a desired Q factor.

Furthermore, the example embodiment of FIG. 1 uses bond wires 113 to achieve the inductance value L1. In this example, the bond wires 113 extend from one pad to another over the die 110, thereby saving lateral space by not intruding on a lateral extent of the PCB 120 outside the area of the die 110. Example bond wires 113 may include gold wires having a cross-sectional diameter of one mil and a length tuned to provide the desired value for L1. For example, if the desired value for L1 is 300 pH and the desired value for C1 is 12 pF, then simulation or other technique may be used to choose a length for a given bond wire 113 to achieve 300 pH. Of course, the scope of embodiments may include any appropriate dimension and any appropriate value for L1 and C1.

Various embodiments may achieve a higher Q factor for bond wires 113 by increasing a height of bond wires above a top surface of die 110. For instance, the higher the bond wire 113 is from die 110 the less the inductive coupling between the bond wire 113 and various conductive features within die 110. Another technique to increase the Q factor is to use multiple bond wires rather than a single bond wire. For instance, some embodiments may use two bond wires 113 to achieve the inductive value L1, though the scope of embodiments may include any appropriate number of bond wires.

Figure 2:
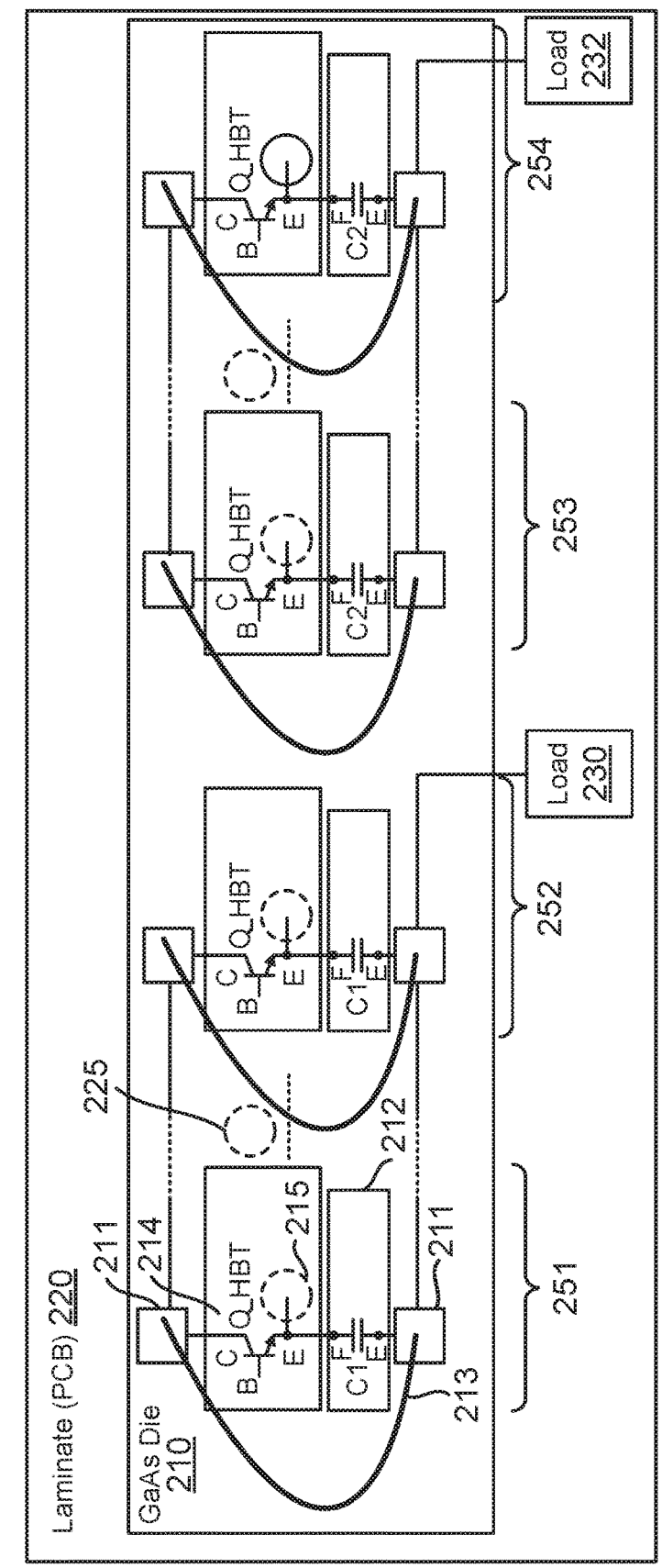
FIG. 2 illustrates an example amplifier architecture in accordance with another embodiment of the disclosure.

FIG. 2 is a top-down illustration of an example system 200 including multiple power amplifiers implemented on a semiconductor die 210, according to one embodiment. The semiconductor die 210 itself is mounted upon PCB 220. Focusing on cell 251, the core transistor 214 has an emitter that is coupled to backvia 215. Backvia 215 is disposed within semiconductor die 210 to couple core transistor 214 to a solder ball or other conductive connection (not shown) at a bottom side of semiconductor die 210. Backvia 215 is electrically coupled to PCB via 225, which couples backvia 215 to a PCB ground plane (not shown). It is understood that in a true top-down view, backvia 215 and PCB via 225 would be obscured from view by the semiconductor material of die 210, but vias 215 and 225 are shown here for ease of illustration.

Capacitor C1 is implemented on die 210, as in the example of FIG. 1. Furthermore, bond wire 213 is coupled between pads 211 to form a loop between the collector and emitter of the core transistor 214, similar to that shown in FIG. 1. Cell 252 is substantially similar to cell 251 and is also coupled to PCB via 225, so that both cells 251 and 252 operate to amplify an RF signal and provide that amplified RF signal to load 230.

Furthermore, cells 253 and 254 are substantially similar to cell 251 and amplify an RF signal for load 232. In one example, load 230 and load 232 may each have a different impedance, e.g., 50 ohms versus 12 ohms. Continuing with the example, cells 251 and 252 may include capacitive values for C1 and inductive values for bond wires to match 50 ohms at the load 230. Similarly, cells 253 and 254 may include capacitive values for C2 and inductive values for their respective bond wires to match 12 ohms at load 232.

Thus, the embodiment of FIG. 2 illustrates a multi-section amplifier system serving two loads 230, 232. The first section includes cells 251 and 252 having impedance matching circuits to serve load 230. The second section includes cells 253 and 254 with impedance matching circuits to serve load 232. Each cell 251-254 may be implemented according to the design shown in the embodiment of FIG. 1 to reduce the amount of RF current at respective emitters of core transistors by forming a loop with the matching inductor and capacitor to bypass backvias and PCB vias.

Various embodiments may include any appropriate number of sections for a given application. For instance, some embodiments may include at least one section for a given load. Furthermore, a particular section may include any appropriate number of cells. Examples of loads 230 and 232 may include antennas or other components that receive the amplified RF signal. The system 200 itself may further be implemented in a wireless device, such as a smart phone or tablet computer along with other components, such as a power supply (not shown) and a system on chip (not shown) having various processors.

Figure 3:
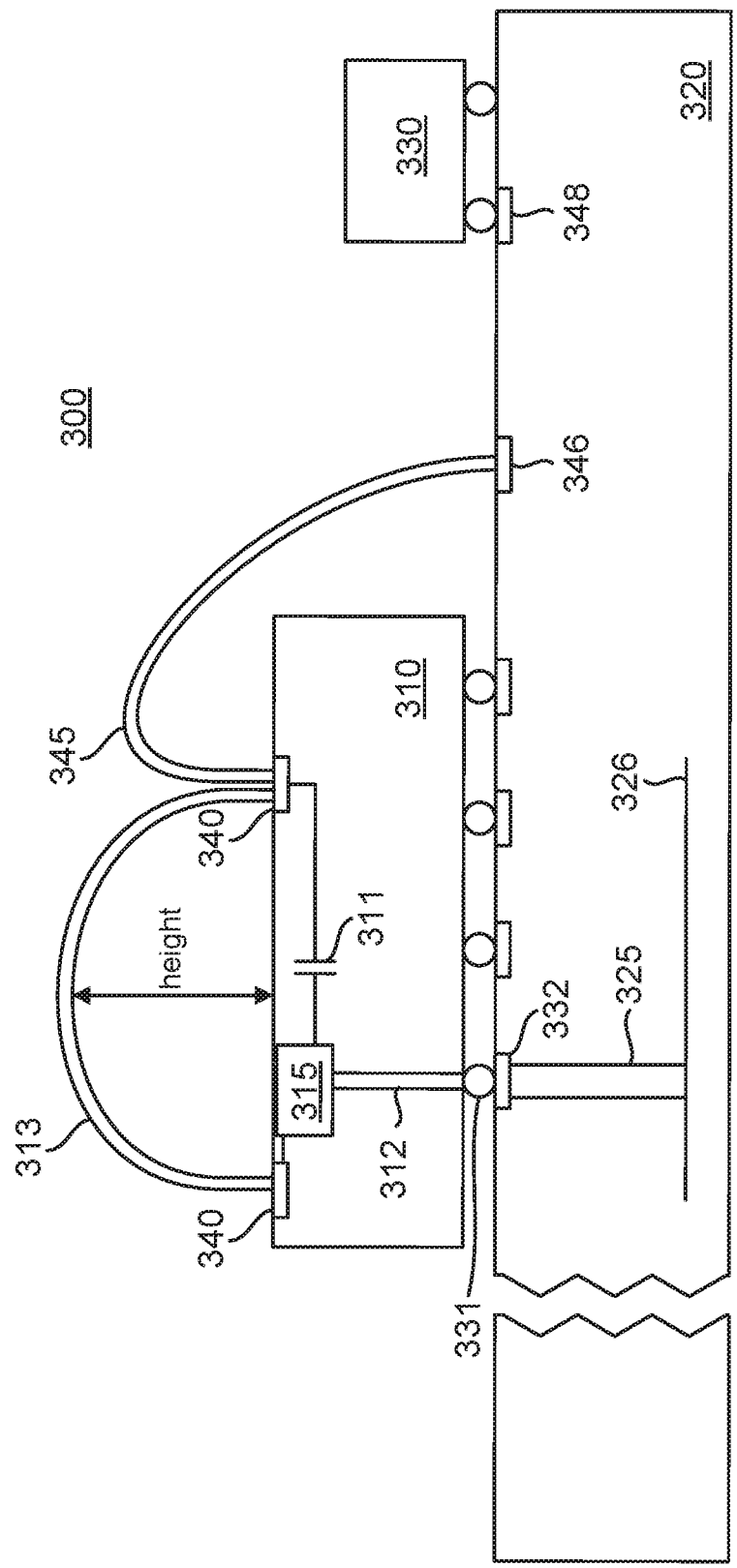
FIG. 3 illustrates an example amplifier architecture in accordance with another embodiment of the disclosure.

FIG. 3 is an illustration of example amplifier configuration 300, adapted according to one embodiment. FIG. 3 provides a cut-away side view of an amplifier system adapted according to the principles described above with respect to FIGS. 1 and 2. Semiconductor die 310 is mounted to PCB 320 by solder balls (e.g., solder ball 331) and conductive pads (e.g., conductive pad 332). Although not shown in FIG. 3, various embodiments may include adhesive material between semiconductor die 310 and PCB 320.

Core transistor 315 is conductively coupled to backvia 312, which is conductively coupled to PCB via 325 and to ground plane 326. Core transistor 315 is also conductively coupled to capacitor 311. Bond wire 313 is coupled between conductive pads 340 and coupled to capacitor 311 to provide a loop between a collector and an emitter of core transistor 315, as shown above with respect to FIG. 1. A height of the bond wire 313 is illustrated, though not drawn to scale, with respect to a top surface of semiconductor die 310. As noted above, the height of bond wire 313 affects an amount of inductive coupling between the bond wire 313 and other conductive components within the semiconductor die 310. Accordingly, various embodiments use a height that is determined by simulation or other technique to provide an appropriately low amount of coupling to increase a Q factor of the inductor embodied by bond wire 313.

Bond wire 313 and capacitor 311 are used as a matching circuit having an appropriate LC value to match impedance of load 330. The matching circuit may be coupled to load 330 using any appropriate conductive path. For instance, in the embodiment of FIG. 3, an additional bond wire 345 couples the matching circuit to a pad 346, where other traces (not shown) within PCB 320 are in electrical communication with pad 348 and load 330. However, the scope of embodiments may include any appropriate conductive path from the matching circuit to the load 330.

Although not shown in FIG. 3, it is understood that the amplifier configuration may include additional cells and perhaps additional sections, arranged similarly to the arrangement shown in FIG. 2. Furthermore, the bond wire 313 may be encapsulated using an adhesive or other appropriate material to protect against mechanical forces and to ensure the physical integrity of the device. The illustration of FIG. 3 shows the amplifier configuration 300, and it is understood that PCB 320 may in some embodiments include other components (e.g., a system on chip, power supply, additional loads) and may be included with other PCBs within a housing of a finished wireless device.

In some instances, backvia 312 may be formed using gold or other appropriate conductive material. In fact, the selection of conductive material for backvia 312 may be made in accordance with a material of the semiconductor die 310. For instance, the embodiments described above refer to a GaAs die, though the scope of embodiments may include any appropriate semiconductor technology. For instance, die 310 may include a silicon die in other applications. Via 325 may be formed as a hole vertically extending through PCB 320 and being filled or partially filled with a metal such as copper.

The example of transistors in the embodiments of FIGS. 1 and 2 include heterojunction bipolar transistors (HBTs), though it is understood that other embodiments may use other transistor technologies. For instance, another embodiment may use field effect transistor technology or bipolar junction transistor technology. In an example embodiment using CMOS technology, die 310 may instead include a silicon die, and the matching inductor may be formed using a trace on PCB 320 rather than bond wire 313.

Figure 4:
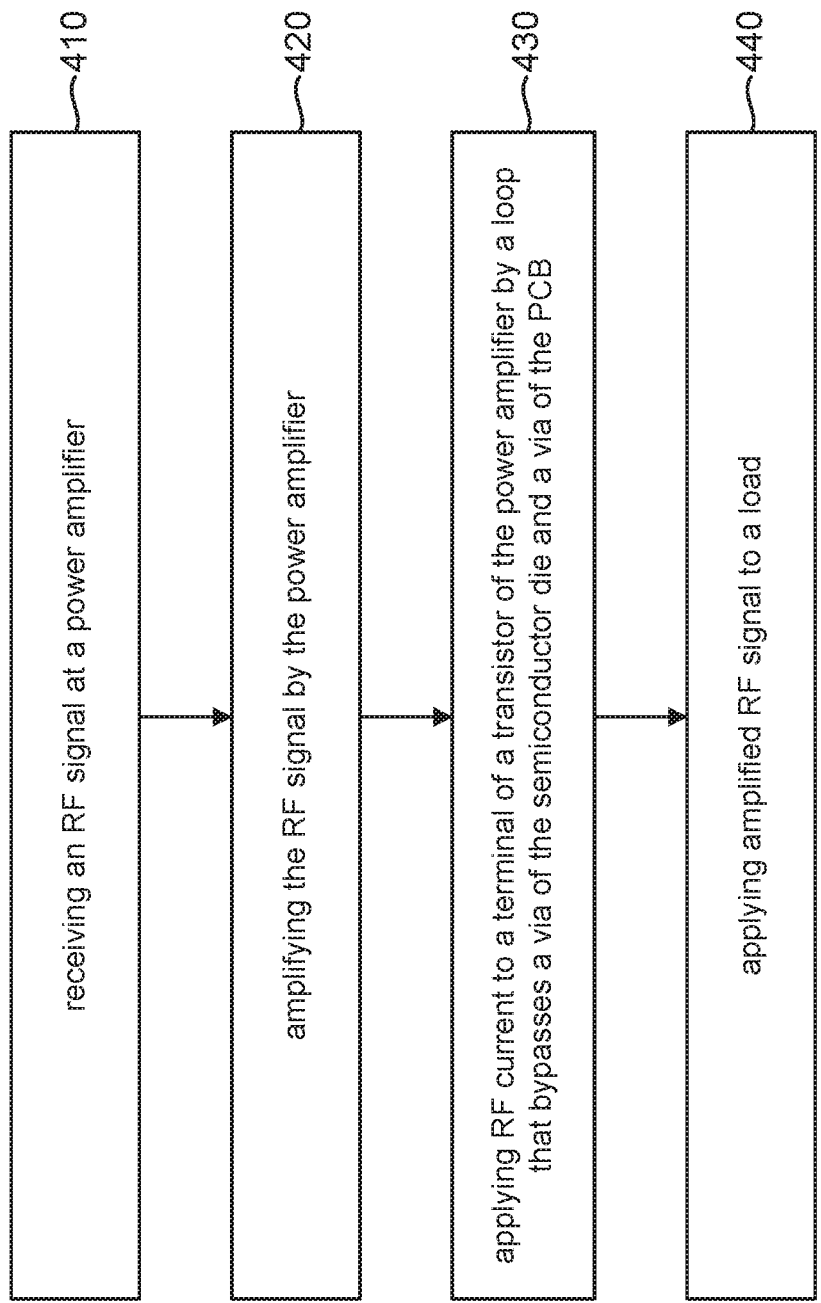
FIG. 4 is an illustration of an example method to be performed with any of the amplifier architectures of FIGS. 1-3 according to an embodiment of the disclosure.

FIG. 4 is an illustration of an example method 400 in which an RF power amplifier according to the embodiments of FIGS. 1-3 may be used. For instance, the actions of FIG. 4 may be performed by a power amplifier having a transistor receiving the RF signal at its control terminal. An example is shown in FIG. 1, where the core transistor Q_HBT receives RF signal 141 at its base. However, as noted above, other embodiments may use a bipolar junction transistor or may even use a field effect transistor formed using CMOS technology.

A capacitor is coupled to a first terminal of the transistor. An example is shown at FIG. 1, where capacitor C1 is coupled to the emitter of the core transistor Q_HBT. In another example (not shown) a capacitor may be coupled to a source or a drain of a field effect transistor.

Continuing with the example, an inductor is coupled to a second terminal of the transistor and is also coupled to the capacitor. The capacitor and inductor form a loop from the first terminal of the transistor to a second terminal of the transistor. In the example of FIG. 1, the inductor is formed using bond wires 113 and is coupled to the collector of the core transistor Q_HBT. This forms a loop from the collector terminal and power supply (e.g., VCC) through the inductor and capacitor to the emitter terminal. The load is coupled to a node between the inductor and the capacitor. The loop between the collector and the emitter (or in the case of a field effect transistor, between drain and source or source and drain) defines a path of the RF current during normal operation of the amplifier.

Continuing with the example, the emitter terminal of the core transistor may be further coupled to a ground plane through one or more backvias of the semiconductor die and further through one or more vias of the PCB. The RF current loop bypasses the backvia of the semiconductor die and the via of the PCB by terminating at a node between the emitter and any backvia. While such an architecture may not completely eliminate emitter degeneration in some applications, bypassing the parasitic inductance of the backvias and vias may substantially reduce the amount of RF current seen at the emitter, thereby reducing emitter degeneration to acceptable levels for a particular application. Further in this example, the capacitor may be formed as a component on the same semiconductor die as the core transistor, and the inductor may be formed using one or more over-die bond wires.

At action 410, the RF signal is received at the power amplifier. An example is shown in FIG. 1, where the RF signal is received at a power amplifier input 150 and provided to a driver amplifier 140. The signal 141 output from the driver amplifier 140 is then provided to the control terminal of the core transistor. Thus, the embodiment of FIG. 1 employs driver amplifier 140 in addition to the amplifier having the core transistor Q_HBT. The scope of embodiments may include receiving the RF signal through any appropriate components, such as drivers, filters, and the like.

Example method 400 continues with action 420, wherein the power amplifier amplifies the RF signal. The example of FIGS. 1-3 use the core transistor as an amplifier by applying the RF signal 141 to the base. The power supply VCC at one terminal of the transistor provides a voltage that is larger than the voltage swing of the RF signal at the base. Thus, the resulting current at the collector of the transistor is larger than the current at the base and is modulated by the applied RF signal.

Example method 400 continues with action 430, wherein RF current is applied to a terminal of the transistor of the power supply by the loop described above. In this example, RF current follows the loop shown by arrows in FIG. 1. The amplified RF current is seen at both the collector and the emitter terminals. The components of the loop serve to match an impedance of the load.

At action 440, the amplified RF signal is applied to a load. An example is shown at FIGS. 1-3, where the example loads are illustrated as items 130, 230, 232, and 330. Examples of loads include antennas, output jacks, and the like.

While example method 400 is illustrated as a series of discrete steps, it is understood that the scope of embodiments is not so limited. Rather, as the RF signal is applied to the control terminal of the transistor, actions 410-440 happen together, but FIG. 4 illustrates the actions separately for ease of discussion.

Additionally, the scope of embodiments is not limited to the actions shown in FIG. 4. Instead, various embodiments may add, omit, modify, or rearrange one or more actions. For instance, in an embodiment similar to that shown in FIG. 2, multiple cells may receive the RF signal and amplify the RF signal. Also, multiple sections may receive different, respective RF signals and provide amplified RF signals to respective loads.

As those of some skill in this art will by now appreciate and depending on the particular application at hand, many modifications, substitutions and variations can be made in and to the materials, apparatus, configurations and methods of use of the devices of the present disclosure without departing from the spirit and scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A circuit comprising:
   a radio frequency (RF) amplifier including a transistor configured to receive an RF signal at its control terminal, an inductor coupled to a first terminal of the transistor, a capacitor coupled to a second terminal of the transistor, wherein the capacitor and the inductor form a loop from the first terminal to the second terminal, wherein the loop bypasses a parasitic inductance between the second terminal and ground, further wherein the inductor is disposed between a load and the first terminal and the capacitor is disposed between the second terminal and the load, and wherein the second terminal of the transistor is shorted to the capacitor; and
   a semiconductor die on which the transistor and the capacitor are formed, wherein the semiconductor die includes a backvia coupled with the second terminal of the transistor, and wherein the loop bypasses the backvia.

2. The circuit of claim 1, wherein the inductor includes an over-die bond wire coupling pads on the semiconductor die that includes both the transistor and the capacitor.

3. The circuit of claim 2, wherein the semiconductor die comprises a GaAs die.

4. The circuit of claim 1, wherein the capacitor is floating with respect to a voltage of the RF signal.

5. The circuit of claim 1, wherein the parasitic inductance between the second terminal and ground is associated with a via.

6. The circuit of claim 1, further comprising:
   a printed circuit board on which the semiconductor die is mounted, wherein the printed circuit board includes a via coupled with the backvia and a ground plane, further wherein the parasitic inductance is associated with the backvia and the via.

7. The circuit of claim 1, wherein the transistor comprises a heterojunction bipolar transistor (HBT).

8. The circuit of claim 1, wherein the load comprises an antenna coupled to a node between the capacitor and the inductor, wherein the antenna is configured to receive the RF signal amplified by the transistor.

9. The circuit of claim 8, further wherein the loop including the capacitor and the inductor is impedance matched to the antenna.

10. A radio frequency (RF) amplifier circuit comprising:
    a semiconductor die having a transistor formed therein, the transistor including a control terminal configured to receive an RF signal, the transistor further including a first terminal coupled with a power supply and a second terminal coupled with a ground plane;
    a printed circuit board (PCB) on which the semiconductor die is mounted, wherein the PCB includes the ground plane and a first via coupling the ground plane to a second via coupled to the second terminal of the transistor; and
    a capacitor and an inductor coupled between the first terminal of the transistor and the second terminal of the transistor to form a loop that terminates at a first node between the second terminal and the second via, the capacitor and the inductor matching an impedance of a load of the amplifier circuit, further wherein the inductor is disposed between the load and the first terminal, and the second terminal of the transistor is shorted to the capacitor.

11. The RF amplifier circuit of claim 10, wherein the load comprises an antenna coupled with a second node between the capacitor and the inductor.

12. The RF amplifier circuit of claim 10, wherein the semiconductor die comprises a GaAs die.

13. The RF amplifier circuit of claim 12, wherein the transistor comprises a heterojunction bipolar transistor.

14. The RF amplifier circuit of claim 10, wherein the capacitor is formed on the semiconductor die.

15. The RF amplifier circuit of claim 10, wherein the inductor comprises an over-die bond wire.

16. The RF amplifier circuit of claim 10, wherein the capacitor floats with respect to a voltage of the RF signal.

17. The RF amplifier circuit of claim 10, wherein the second via comprises backvias of the semiconductor die.

18. The RF amplifier circuit of claim 10, wherein the inductor comprises a plurality of over-die bond wires.

19. A computing device configured to communicate by a wireless radio frequency (RF) technology, the computing device comprising:
    a semiconductor die;
    a transistor formed on the semiconductor die, the transistor configured to receive an RF signal at a control terminal and to output an amplified RF signal at a first terminal, the transistor having a second terminal coupled to a ground plane by a first via in the semiconductor die; and
    a load component receiving the amplified RF signal from the transistor; and
    means for matching an impedance of the load component, wherein the means for matching the impedance comprises an impedance path from the first terminal of the transistor to the second terminal of the transistor and bypassing a parasitic inductance of the first via, wherein the impedance path includes an inductor disposed between the load component and the first terminal, and the second terminal of the transistor is shorted to a capacitor disposed between the load component and the second terminal.

20. The computing device of claim 19, wherein the semiconductor die comprises a GaAs die.

21. The computing device of claim 19, wherein the load component comprises an antenna.

22. The computing device of claim 19, wherein the capacitor is formed on the semiconductor die; and
    wherein the inductor comprises an over-die bond wire coupled with the capacitor and the first terminal.

23. The computing device of claim 22, wherein the load component is coupled with a node between the capacitor and the over-die bond wire.

24. The computing device of claim 22, wherein the capacitor floats with respect to a voltage of the amplified RF signal.

25. The computing device of claim 19, further comprising:
a printed circuit board (PCB) upon which the semiconductor die is mounted, the printed circuit board including the ground plane and further including a second via coupling the first via to the ground plane.

26. The computing device of claim 19, wherein the transistor comprises a heterojunction bipolar transistor.

27. The computing device of claim 19, wherein the inductor includes a plurality of bond wires coupled to a surface of the semiconductor die.

28. The computing device of claim 19, wherein the first terminal comprises a collector, and wherein the second terminal comprises an emitter.

29. A method comprising:
receiving an RF signal at a power amplifier; and
amplifying the RF signal by the power amplifier, wherein the power amplifier includes a transistor receiving the RF signal at its control terminal, an inductor coupled to a first terminal of the transistor, and a capacitor coupled to a second terminal of the transistor, wherein the capacitor and the inductor form a loop from the first terminal to the second terminal, wherein the loop bypasses a parasitic inductance attributable to a via between the second terminal and ground, further wherein the inductor is disposed between a load and the first terminal, and the second terminal is shorted to the capacitor, wherein the via is formed on a same semiconductor die with the transistor and the capacitor.

* * * * *